United States Patent [19]

Smith

[11] 4,011,927
[45] Mar. 15, 1977

[54] LONG TIME PERIOD ASTABLE MULTIVIBRATOR CIRCUIT WITH INDEPENDENTLY ADJUSTABLE TIME CONSTANTS

[75] Inventor: Carl H. Smith, Spring Valley, N.Y.

[73] Assignee: Auto Research Corporation, Rochelle Park, N.J.

[22] Filed: Mar. 7, 1975

[21] Appl. No.: 556,204

[52] U.S. Cl. .............................. 184/26; 307/246; 307/294; 328/129; 222/70; 361/197
[51] Int. Cl.² ...................... B61D 15/00; H03K 5/13
[58] Field of Search ................. 307/246, 293, 294; 328/129, 131; 317/141 S; 222/70; 186/26

[56] References Cited

UNITED STATES PATENTS

| | | | |
|---|---|---|---|
| 3,388,346 | 6/1968 | Roof et al. | 307/293 |
| 3,461,322 | 8/1969 | Hirsch et al. | 328/129 |
| 3,486,044 | 12/1969 | Hirsch | 307/293 |
| 3,589,563 | 6/1971 | Carragan et al. | 222/70 |
| 3,694,672 | 9/1972 | Buyak | 307/293 |
| 3,726,437 | 4/1973 | Siegel | 222/70 |
| 3,739,944 | 6/1973 | Rogerson | 222/70 |
| 3,837,532 | 9/1974 | Sahatjian | 222/70 |

*Primary Examiner*—Stanley D. Miller, Jr.
*Attorney, Agent, or Firm*—Ostrolenk, Faber, Gerb & Soffen

[57] ABSTRACT

A solid state electronic dual timer which, in one preferred embodiment, is utilized for dispensing a measured quantity of lubricant at predetermined time intervals. A continuously operating pump is selectively connected to the devices requiring lubricant by a control valve means. A capacitor is charged through a first circuit path from one predetermined level until it reaches a second predetermined level during which time the control valve means for dispensing the lubricant is energized. As soon as a second predetermined level is achieved, the pump means is deenergized, at which time the capacitor is caused to discharge towards said first predetermined level at a slow rate. The charging rate is typically adjustable over a range between 2-90 seconds in charging from said first to said second predetermined level and is further adjustable over a range which is typically of the order of a few minutes to several hours when discharging from said second to said first predetermined level so as to dispense lubricant during a period of from 2-90 seconds every two hours, for example, said interval being repeated on a cyclic basis.

11 Claims, 3 Drawing Figures

LONG TIME PERIOD ASTABLE MULTIVIBRATOR CIRCUIT WITH INDEPENDENTLY ADJUSTABLE TIME CONSTANTS

BACKGROUND OF THE INVENTION

In lubricating systems it is typical to provide a cyclically operable lubricant pumping apparatus which is periodically activated to dispense a predetermined quantity of lubricant.

Since the metering of the flow of lubricant is adjusted to provide lubricating fluid sufficient for a substantial operating interval, the pump is typically operated to supply lubricant over a short span of time, usually of the order of 2–90 seconds, at intervals separated by substantially long periods which are usually of the order of hours.

The devices typically employed to provide such operation usually comprise a motor operated cam which rotates at a very slow rpm, typically obtained by the use of a reducing gear mechanism between the motor output and the cam. At brief time periods during each long time interval, the cam functions to activate a pump for dispensing a predetermined quantity of lubricant. Such mechanisms are both complicated and costly.

BRIEF DESCRIPTION OF THE INVENTION

The present invention relates to timing mechanisms and more particularly to a dual timer of the electronic solid state type which is adapted to activate a dispensing mechanism at an adjustable rate usually of the order of seconds, with said activation occurring at regular intervals which are of the order of several hours.

The present invention is characterized by providing an electronic solid state dual timer mechanism which is quite inexpensive compared with electromechanical devices presently being utilized while at the same time providing the same timing functions.

In the present invention, capacitance means is selectively charged and discharged between two predetermined voltage levels. Assuming the circuitry is in the discharge phase, as soon as the capacitor discharges to said first voltage level, first comparator means activates an electronic switch means which, in turn, energizes the lubricant dispensing means (which may, for example, be pumping means). As soon as the capacitor charges to said second voltage level from said first voltage level (which usually takes of the order of 2–90 seconds) second comparator means deactivates the electronic switch means to turn off the pumping means and further activates the circuit to begin discharge of the capacitance which discharges at a slow rate determined by a second group of resistive elements coupled in the discharge path. The electronic switch means maintains the pump means deactivated until the capacitor discharges to said first voltage level, at which time said first comparator means again reactivates the electronic switch means and turns on the pump means until said capacitor charges to said second voltage level. Utilization of adjustable resistance elements enables the charging rate to be adjusted usually over a range from 2–90 seconds, for example, and further adjustable resistance means enables the discharge rate to be adjusted from a typical range of a few minutes to several hours thereby yielding operation equivalent to the present day electromechanical devices while providing satisfactory operation at a fraction of the cost of such present day electromechanical devices.

It is therefore one object of the present invention to provide a novel electronic solid state dual timer which is adapted to activate a load over a brief time interval at a cyclic rate which is typically of the order of several hours.

BRIEF DESCRIPTION OF THE DRAWINGS

The above as well as other objects of the present invention will become apparent when reading the accompanying description and drawings in which.

DETAILED DESCRIPTION OF THE INVENTION

Figure 1:
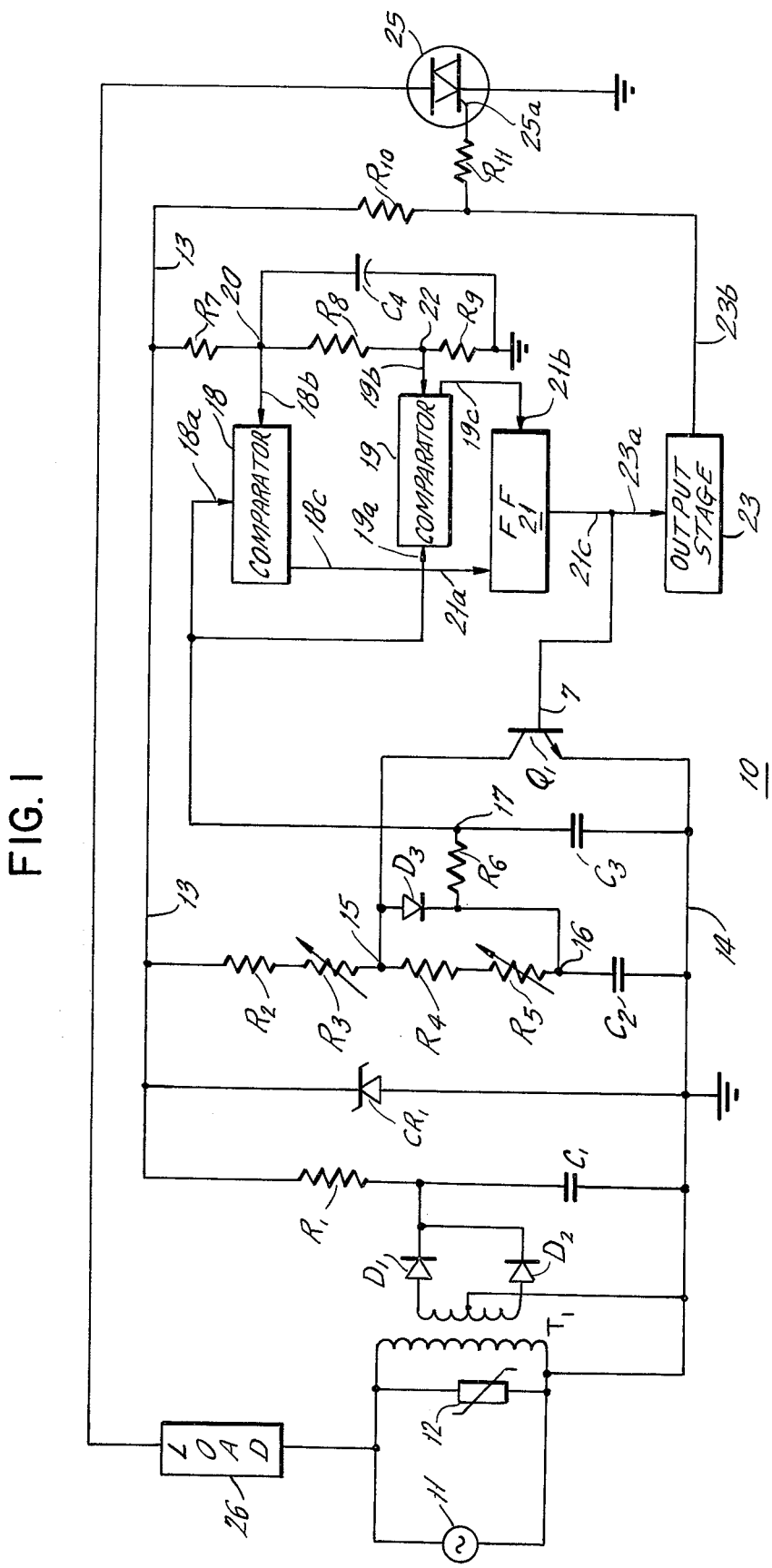
FIG. 1 is a schematic diagram of an electronic solid state dual timer embodying the principles of the present invention.

The dual timer 10 of the present invention is shown in the sole FIGURE as being comprised of a 115 volt 50/60 Hz a.c. source 11 coupled across varistor 12 which is utilized to protect the circuit from over-voltage spikes developed in the supply line. The primary winding of transformer T1 is connected across varistor 12, while the secondary winding thereof is coupled to diodes D1 and D2 to provide for full-wave rectification of the 24 volt a.c. signal developed across the transformer secondary winding. Resistor R1, capacitor C1 and Zener diode CR1 serve to filter and regulate the d.c. output developed between power bus 13 and common bus 14. Resistors R2, R3, R4 and R5 and capacitor C2 are connected in series between d.c. power bus 13 and ground bus 14. Resistors R3 and R5 are adjustable for adjusting the desired timing intervals of the dual timer.

Diode D3 is connected across common terminal 15 between R3 and R4 and common terminal 16 between R5 and C2. Common terminal 16 is further connected to ground bus 14 through resistor R6 and capacitor C3. Capacitor C2 provides the timing for the dual interval timer in a manner to be more fully described.

The common terminal 17 between R6 and C3 is connected in common to input 18a of comparator 18 and to input 19a of comparator 19. Common terminal 15 is connected to the collector electrode of transistor Q1 which selectively discharges capacitor C2 in a manner to be more fully described. Capacitor C3 and resistor R6 collectively form a low pass filter to prevent transient spikes appearing at terminal 16 from being applied to inputs 18a and 19a.

Comparator 18 has its second input terminal 18b coupled to common terminal 20 between resistors R7 and R8 which, together with resistor R9 are connected between power bus 13 and ground. Capacitor C4 is connected in parallel across R8 and R9 to prevent erroneous operation of the circuitry due to transients.

Output 18c of comparator 18 is coupled to input 21a of bistable flip-flop 21. Input 19b is coupled to the common terminal 22 between the resistors R8 and R9. Output 19c of comparator 19 is coupled to input 21b of bistable flip-flop 21. Output 21c of the bistable flip-flop is connected in common to the base electrode of transistor Q1 and the trigger input of output stage 23 which may, for example, be a transistor. Output 23b of output stage 23 is coupled to the common terminal 24 between resistors R10 and R11. The opposite terminal of R10 is coupled to power bus 13 while the opposite terminal of resistor R11 is coupled to the control input 25a of a triac 25 whose remaining terminals are connected between load 26 and ground. The opposite terminal of the load 26 is coupled to a.c. source 11.

In operation, transistor Q1 conducts to slowly discharge capacitor C2 through R4 and R5. The voltage level at terminal 17 is simultaneously applied to input 18a of comparator 18 and to input 19a of comparator 19. When the level at input 19a falls to a voltage level below the input to 19b established by the voltage divider comprised of resistors R7, R8 and R9, the output 19c of comparator 19 sets bistable flip-flop 21. Output 21c of bistable flip-flop 21 goes low turning off transistor Q1. Simultaneously therewith the application of a low level to input 23a of output stage 23 causes output 23b to go high. The voltage across capacitor C2 is now free to increase exponentially with a time constant $T_1 = (R2+R3) \cdot C2$, since diode D3 is forward biased at this time. When the voltage across capacitor C2 exceeds the voltage drop across resistors R8 and R9, output 18c of comparator 18 resets bistable flip-flop 21 causing transistor Q1 to conduct to discharge capacitor C2 through R4 and R5 (diode D3 being back biased) and simultaneously causing output 23b of output stage 23 to go low.

The circuit triggers on the negative going input signal applied to input 19a of comparator 19 when the level applied thereto falls below the reference level applied to input 19b of comparator 19. However, even though transistor Q1 provides substantially a short circuit path between terminal 15 and ground, the connection of the collector electrode of Q1 to the anode of diode D3 reverse-biases diode D3 so that capacitor C2 discharges through R4 and R5.

The discharge time T of capacitor C2 is determined by $T_2 = (R4+R5) \cdot C2$ and hence terminal 17 requires a predetermined time interval to fall below the threshold value established at input terminal 18b of comparator 18 before triac 25 is again caused to turn on.

It can thus be seen that capacitor C2 charges through R2 and R3 and discharges through R4 and R5 with the relative time durations being of the order of 5 minutes-several hours and 2-90 seconds respectively. Thus the triac 25 is turned on when the voltage level at terminal 17 falls below the reference level at terminal 22 (detected by comparator 19) and triac 25 remains turned on (usually for a time interval in the range between 2–90 seconds in one preferred embodiment) until the voltage at terminal 17 charges to a value equal to the voltage level at terminal 20 (detected by comparator 18) at which time triac 25 is turned off and remains off until the voltage level at terminal 17 again discharges to the level at terminal 22.

Figure 3:
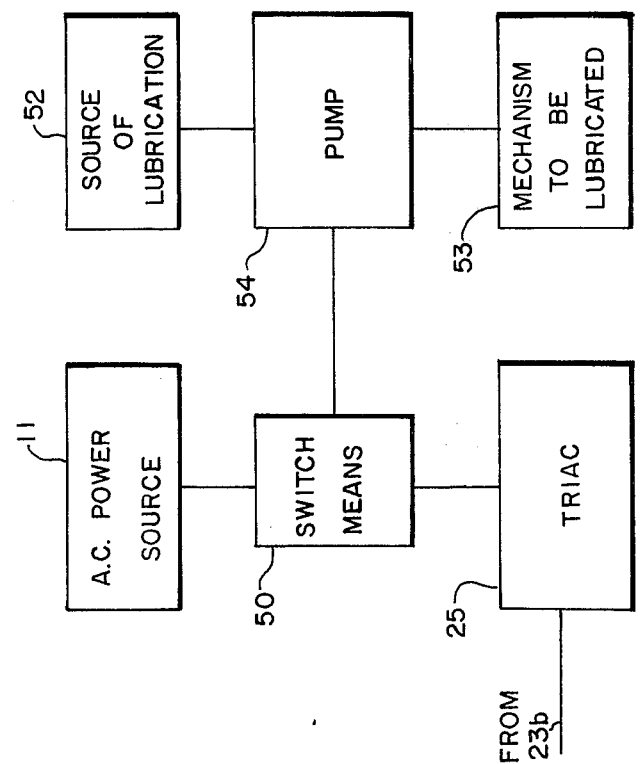
FIG. 3 is a block diagram of a second lubrication system controlled by the electronic timer of FIG. 1.
Figure 2:
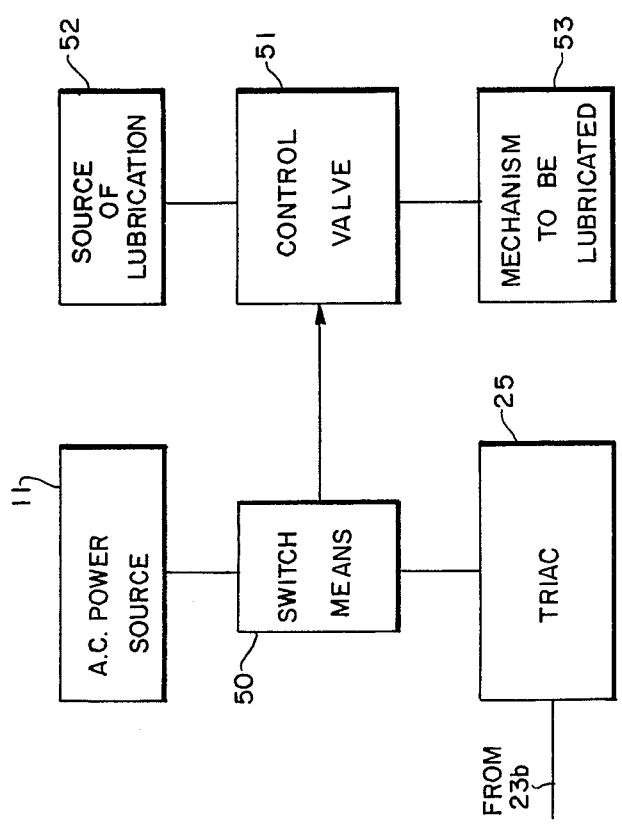
FIG. 2 is a block diagram of a lubrication system controlled by the electronic timer of FIG. 1.

This application has been found to be of extremely advantageous value in cyclic lubricator devices which require dispensing of a predetermined amount of lubricant at periodic intervals. For example, it may be required that the devices being lubricated require a predetermined amount of lubricant per hour. By energizing triac 25 over a predetermined time interval (for example, in the range from 2–90 seconds) every hour the length of time of conduction of triac 25 thereby controls the amount of lubricant dispensed per hour. Thus, energization of triac 25 completes a circuit path between a.c. source 11, load 26 and ground wherein load 26 may, for example, be comprised of switch means 50 (See FIG. 2) for activating a control valve 51 which admits lubricant under pressure 52 into a distribution conduit wherein the lubricant is then dispensed by tapoffs between the distribution conduit and the mechanisms being lubricated 53 wherein the time duration during which the control valve is energized, together with the size of the tapoffs provides the appropriate quantity of lubricant dispensed per time interval. R10 serves as a means for maintaining the current drawn by the circuit substantially constant independent of whether triac 25 is on or off. Alternatively, a pump 54 (see FIG. 3) can be used instead of a control valve. In the latter case, the lubricant need not be under pressure. Although the preferred embodiment teaches a continuously operated pump whose output (lubricant) is relatively connected to the devices requiring lubrication, as an alternative arrangement the "load" 26 may comprise an intermittently operating pump means.

Although there has been described a preferred embodiment of this novel invention, many variations and modifications will now be apparent to those skilled in the art. Therefore, this invention is to be limited, not by the specific disclosure herein, but only by the appending claims.

What is claimed is:

1. Electronic solid state dual timer means for activating load means at periodic intervals comprising:
   a capacitor;
   electronic switch means;
   first comparator means coupled to said capacitor for activating said switch means when said capacitor discharges to a first predetermined voltage level;
   second comparator means coupled to said capacitor for deactivating said switch means when said capacitor charges to a second predetermined level higher than said first predetermined level;
   charging means coupled to said switch means for charging said capacitor at a first rate when said switch means is activated, said charging means including a first resistor means for controlling the charging rate of said capacitor;
   discharging means coupled to said switch means for discharging said capacitor at a second rate when said switch means is deactivated, said discharging means including second resistor means for controlling the discharging rate of said capacitor;
   said first and second resistor means having different magnitudes of ohmic value.

2. The device of claim 1 wherein said ohmic value ($R_2$) of said second resistor means is greater than the ohmic value ($R_1$) of said first resistor means.

3. The device of claim 2 wherein R lies within the range of $4 R_1 \leq R_2 \leq 5000 R_1$.

4. The device of claim 2 wherein the time $T_1$ for charging said capacitor from said first voltage level to said second voltage level is in the range $2 \text{ second} \leq T_1 \leq 90 \text{ seconds}$.

5. The device of claim 4 wherein the time $T_2$ for discharging said capacitor from said second voltage level to said first voltage level is in the range $5 \text{ minutes} \leq T_2 \leq 3 \text{ hours}$.

6. The device of claim 1 wherein said charging means further comprises first diode means for coupling said first resistor means to said capacitor when said discharging means is deactivated.

7. The device of claim 6 wherein said discharging means comprises second electronic switch means coupled between said first resistor means and said capacitor for back biasing said diode means, said second resistor means being coupled between said second electronic switch means and said capacitor whereby said diode means is forward biased when said second electronic switch is deactivated to rapidly charge said capacitor through said first resistor means and whereby said diode means is reverse biased when said second electronic switch means is activated to slowly discharge said capacitor through said second resistor means and said second electronic switch means.

8. The device of claim 1 further comprising a power source and a load, said electronic switch means coupling said load to said source only when said capacitor is charging.

9. The device of claim 8 further comprising a source of lubricant under pressure and a mechanism to be periodically lubricated; said load being comprised of control valve means for dispensing a predetermined quantity of lubricant from said source to said mechanism.

10. The device of claim 8 further comprising a source of lubricant and a mechanism to be periodically lubricated; said load being comprised of pump means for dispensing a predetermined quantity of lubricant from said source to said mechanism.

11. The device of claim 9 wherein said power source is an A.C. power source, said device further comprising means for rectifying the output of said A.C. power source to develop a regulated D.C. output;

said charging means being coupled to said rectifying means.

* * * * *